(12) United States Patent
Aoshima

(10) Patent No.: US 7,867,408 B2
(45) Date of Patent: Jan. 11, 2011

(54) ANISOTROPIC WET ETCHING OF SILICON

(75) Inventor: Tomoyasu Aoshima, Hamamatsu (JP)

(73) Assignee: Yamaha Corporation, Shizuoka-ken (JP)

( * ) Notice: Subject to any disclaimer, the term of this patent is extended or adjusted under 35 U.S.C. 154(b) by 602 days.

(21) Appl. No.: 11/762,423

(22) Filed: Jun. 13, 2007

(65) Prior Publication Data
US 2007/0231540 A1 Oct. 4, 2007

Related U.S. Application Data

(62) Division of application No. 10/773,244, filed on Feb. 9, 2004, now Pat. No. 7,270,763.

(30) Foreign Application Priority Data

Feb. 10, 2003 (JP) ............................ 2003-032196

(51) Int. Cl.
B44C 1/22 (2006.01)
(52) U.S. Cl. ............................ 216/41; 216/47; 216/83; 216/99; 428/131
(58) Field of Classification Search .................... 216/41, 216/47, 83–99; 428/131
See application file for complete search history.

(56) References Cited

U.S. PATENT DOCUMENTS

| 5,131,978 | A | * | 7/1992 | O'Neill | ..................... 216/2 |
| 5,141,595 | A | | 8/1992 | Darling, Jr. | |
| 5,308,442 | A | | 5/1994 | Taub et al. | |
| 5,738,757 | A | | 4/1998 | Burns et al. | |
| 5,956,600 | A | | 9/1999 | Kuroi et al. | |
| 6,022,751 | A | | 2/2000 | Shindo et al. | |
| 6,326,314 | B1 | | 12/2001 | Merrill et al. | |
| 6,464,842 | B1 | | 10/2002 | Golovchenko et al. | |
| 6,508,946 | B1 | | 1/2003 | Murakami et al. | |

(Continued)

FOREIGN PATENT DOCUMENTS

JP 59-029463 2/1984

(Continued)

OTHER PUBLICATIONS

Wolf et al ., Silicon Processing for the VLSI Sra, vol. 1 , Lattice Press (1986).*

(Continued)

Primary Examiner—Shamim Ahmed
(74) Attorney, Agent, or Firm—Dickstein Shapiro LLP

(57) ABSTRACT

A silicon oxide film is formed on one principal surface of a silicon substrate by thermal oxidation, and thereafter, a silicon nitride film is formed on the silicon oxide film by CVD. A lamination layer of the silicon oxide film and silicon nitride film is selectively dry etched to form a mask opening 22 and leave an etching mask made of a left region of the lamination layer. The substrate is selectively and anisotropically etched with alkali etchant such as TMAH by using the etching mask to form a substrate opening. By setting a ration of the thickness of the silicon oxide film to the thickness of the silicon nitride film to 1.25 or larger or preferably 1.60 or larger, it is possible to prevent the deformation of the etched shape of the inner walls of the openings and cracks in the etching mask.

18 Claims, 6 Drawing Sheets

U.S. PATENT DOCUMENTS 6,580,155 B1 6/2003 Muroyama et al.
6,958,125 B2 * 10/2005 Hiroki ..................... 216/27
6,979,406 B2 * 12/2005 Song et al. ................ 216/11

FOREIGN PATENT DOCUMENTS

| JP | 62-093954 | 4/1987 |
| --- | --- | --- |
| JP | 63-015422 | 1/1988 |
| JP | 01-175268 | 7/1989 |
| JP | 2-159769 | 6/1990 |
| JP | 06-045233 | 2/1994 |
| JP | 08-162395 | 6/1996 |
| JP | 08-248198 | 9/1996 |
| JP | 10-012716 | 1/1998 |
| JP | 11-148868 | 6/1999 |
| JP | 2000-077729 | 3/2000 |
| JP | 2000-88686 | 3/2000 |
| JP | 2000-114248 | 4/2000 |
| JP | 2000-243831 | 9/2000 |

OTHER PUBLICATIONS

Wolf et al., Silicon Processing for the VLSI Era, 1986, Lattice. Press, vol. 1, pp. 114-115, 529, 531-532.
Streetman, Solid State Electronic Devices, 1990, Prentice Hall, 3rd ed., p. 332.
Chinese Office Action dated Sep. 16, 2005 (w/English translation of relevant portions).
Korean Office Action dated Aug. 26, 2005 (w/English Translation).

* cited by examiner

PRIOR ART

ANISOTROPIC WET ETCHING OF SILICON

CROSS REFERENCE TO RELATED APPLICATIONS

This application is a divisional of application Ser. No. 10/773,244, filed Feb. 9, 2004, now issued as U.S. Pat. No. 7,270,763, which further claims priority of Japanese Patent Application No. 2003-032196 filed on Feb. 10, 2003, the entire contents of which are incorporated herein by reference.

BACKGROUND OF THE INVENTION

A) Field of the Invention

The present invention relates to wet etching for selectively and anisotropically etching a silicon substrate with alkali etchant.

B) Description of the Related Art

It is known for wet etching of this kind that a lamination layer of a silicon oxide film and a silicon nitride film (hereinafter called a silicon nitride/silicon oxide lamination layer) is used as an etching mask in order to prevent permeation of alkali etchant (for example, refer to Japanese Patent Laid-open Publication No. 2000-114248).

According to the studies by the present inventor, it has been found that when wet etching is performed by forming a rectangular mask opening through a silicon nitride/silicon oxide lamination layer, the etched silicon region is not rectangular or cracks are formed in the silicon nitride/silicon oxide lamination layer, in some cases.

FIGS. 9 and 10 illustrate the main processes of silicon wet etching in association with the inventor's studies.

In the process shown in FIG. 9, an etching mask 5 is formed on one principal surface of a silicon substrate 1 made of single crystal silicon. An etching stopper film 2 is formed on the other principal surface of the substrate 1. In forming the etching mask 5, after a silicon oxide film 3 is formed on the substrate surface by thermal oxidation, a silicon nitride film 4 is deposited on the silicon oxide film 3 by chemical vapor deposition (CVD). The silicon nitride/silicon oxide lamination layer of the films 3 and 4 are selectively dry etched to form a rectangular mask opening 4A to form an etching mask 5 made of the left silicon nitride/silicon oxide lamination layer. For example, the etching stopper film 2 is made of a silicone oxide film formed by thermal oxidation. If the etching stopper film is used as a membrane or the like, layers of various configurations can be used, such as depositing a silicon nitride layer on the silicon oxide film by CVD.

In the process shown in FIG. 10, by using the etching mask 5 having the mask opening 4A, the substrate 1 is selectively and anisotropically etched to the surface of the etching stopper film 2 with alkali etchant such as tetra-methyl-ammonium-hydroxide (TMAH) to form a substrate opening 1A.

FIG. 11 is a diagram of the substrate shown in FIG. 10 as viewed from the upper side, the cross sectional view of FIG. 10 being taken along line X-X' shown in FIG. 11. The inner wall 5a of the mask opening 4A is curved in an inner convex shape due to film stress of the etching mask 5 or the inner wall 1a of a substrate opening 1A is curved in an inner convex shape due to film stress applied to the substrate 1, to cause a shape abnormality B. When the film stress is large, a crack is formed in the etching mask 5 (particularly the silicon nitride film 4) to cause a crack abnormality A.

SUMMARY OF THE INVENTION

An object of this invention is to provide novel wet etching capable of preventing the above-described abnormalities A and B.

According to one aspect of the present invention, there is provided a wet etching method comprising the steps of: forming a silicon nitride film on a silicon oxide film formed on one principal surface of a silicon substrate, a thickness $T_O$ of the silicon oxide film and a thickness $T_N$ of the silicon nitride film being set to have a film thickness ratio $T_O/T_N$ of 1.25 or larger; selectively etching a lamination layer of the silicon oxide film and the silicon nitride film to form an etching mask made of a left region of the lamination layer; and selectively and anisotropically etching the silicon substrate with alkali etchant by using the etching mask.

By setting the film thickness ratio $T_O/T_N$ of the thickness $T_O$ of the silicon oxide film to the thickness $T_N$ of the silicon nitride film of the lamination layer to 1.25 or larger, the film stress balance of the lamination layer becomes good so that the shape abnormality and crack abnormality can be prevented. It is practically preferable to set the film thickness ratio $T_O/T_N$ in a range from 1.60 to 3.21.

According to another aspect of the present invention, there is provided a wet etching method comprising the steps of: forming a silicon nitride film on a silicon oxide film formed on one principal surface of a silicon substrate; selectively etching a lamination layer of the silicon oxide film and the silicon nitride film to form a mask opening through a partial region of the lamination layer and to form an etching mask made of a left region of the lamination layer; after or before the etching mask is formed, forming a film stress relaxing groove partially in the silicon nitride film, the film stress relaxing groove relaxing film stress applied to the mask opening; and selectively and anisotropically etching the silicon substrate with alkali etchant by using the etching mask.

As the film stress relaxing groove is formed partially in the silicon nitride film of the silicon nitride/silicon oxide lamination layer constituting the etching mask, film stress applied to the mask opening and silicon substrate can be relaxed so that the shape abnormality and crack abnormality can be prevented. It is practically preferable to form one or more of the film stress relaxing film surrounding the mask opening.

As above, when a silicon substrate is selectively and anisotropically etched with alkali etchant, it is possible to suppress the deformation of the etched shape or cracks in the etching mask due to film stress, by setting the film thickness ration $T_O/T_N$ of the thickness TO of the silicon oxide film to the thickness TN of the silicon nitride film of the lamination layer to 1.25 or larger, or by forming the film stress relaxing groove partially in the silicon nitride layer.

DESCRIPTION OF THE PREFERRED EMBODIMENTS

FIGS. 1 to 4 are cross sectional views illustrating the main processes of wet etching according to an embodiment of the invention.

Figure 1:
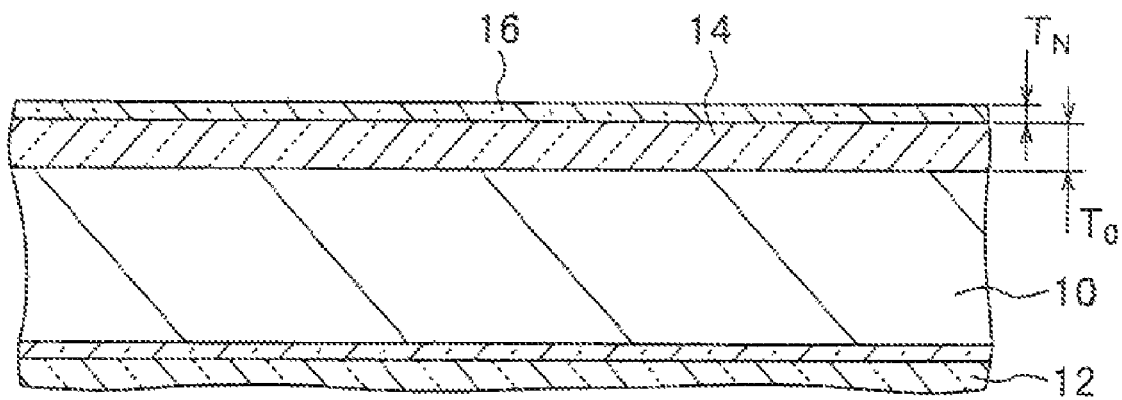
FIG. 1 is a cross sectional view illustrating a process of forming an etching mask material layer to be used when wet etching is performed, according to an embodiment of the invention.

In the process shown in FIG. 1, on one principal surface of a silicon substrate 10 made of single crystal silicon, an etching mask material layer is formed which is a lamination layer of a silicon oxide ($SiO_2$) film 14 and a silicon nitride (SiN) film 16. On the other principal surface of the substrate 10, an etching stopper film 12 made of, for example, SiN is formed with a buffer oxide film being interposed therebetween. The silicon substrate 10 has a thickness of, for example, 450-600 µm in case of 6-inch wafer, and 600-850 µm in case of 8-inch wafer.

In forming the etching mask material layer, after the $SiO_2$ film 14 is formed, for example, by thermal oxidation, the SiN film 16 is deposited on the $SiO_2$ film 14 by low pressure thermal CVD. The conditions of the thermal oxidation process for the $SiO_2$ film 14 may be, for example:

Gas flow rate: $N_2/O_2$=18/10 [in the unit of l/min]
Substrate temperature: 1025 [° C.]

The conditions of the low pressure thermal CVD process for the SiN film 16 may be, for example:

Gas flow rate: $SiH_2Cl_2/NH_3$ (or $NH_3+N_2$)=0.05 to 6/0.5 to 6 [l/min]
Reaction chamber pressure: 60 [Pa]
Substrate temperature: 700 to 800 [° C.]

Figure 2:
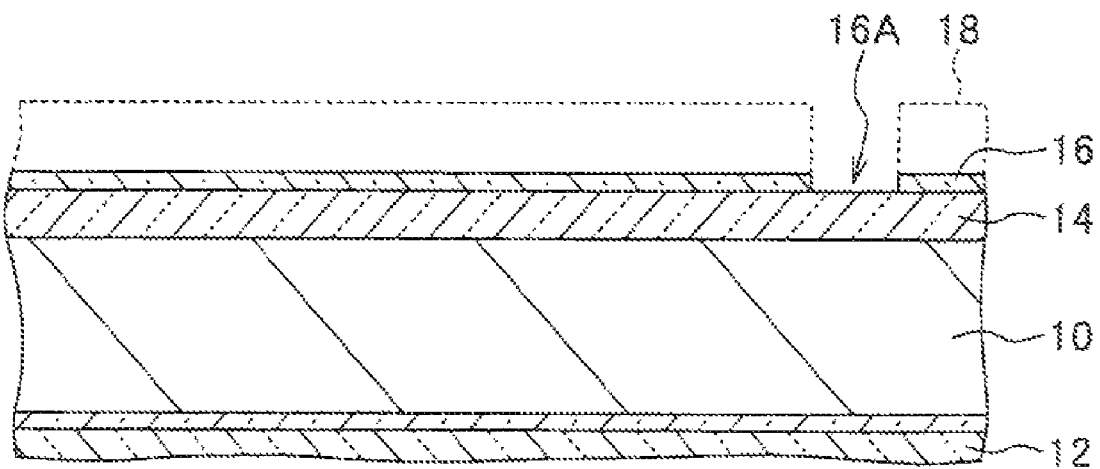
FIG. 2 is a cross sectional view illustrating a film stress relaxing groove forming process following the process shown in FIG. 1.
Figure 5:
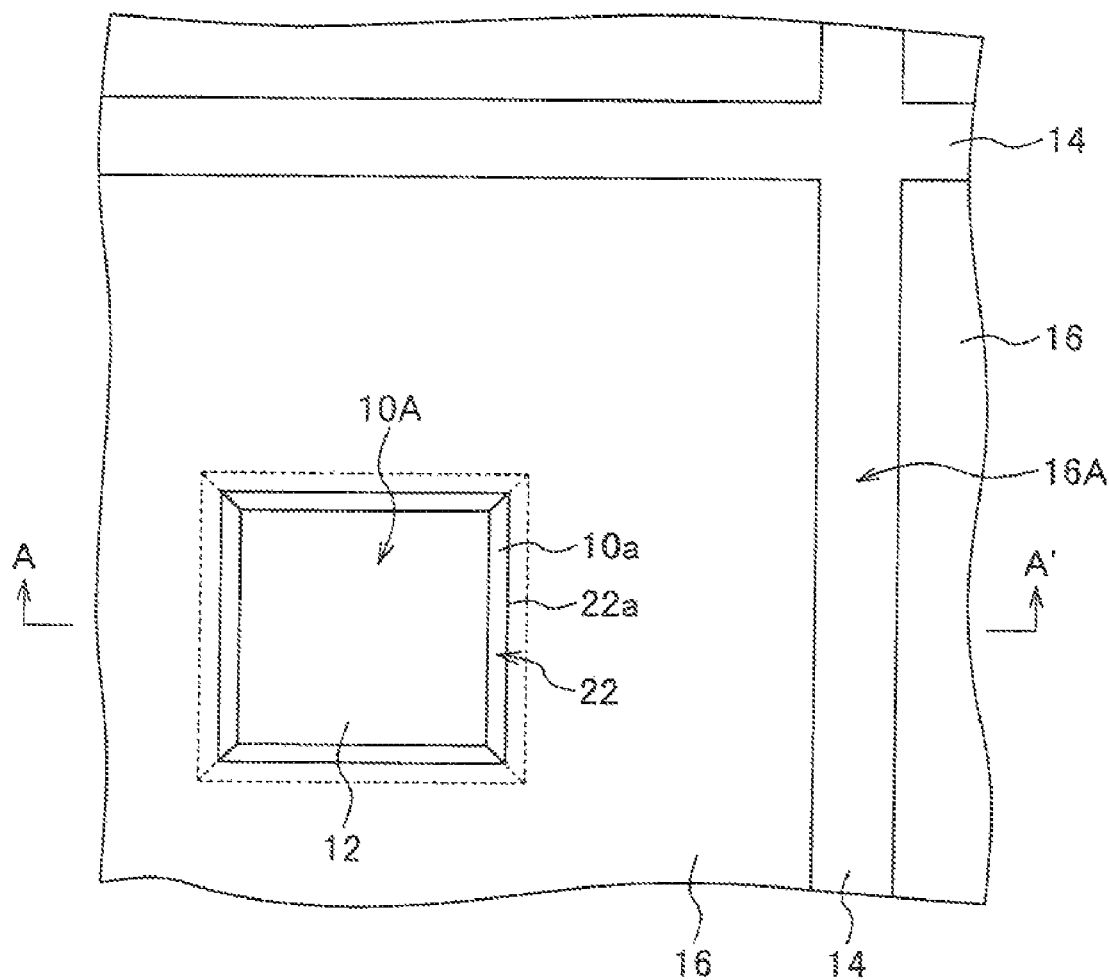
FIG. 5 is a top view of the substrate shown in FIG. 4.

In the process shown in FIG. 2, a selective dry etching process using a resist layer 18 as a mask is performed to form a film stress relaxing groove 16A having a plan pattern shown in FIG. 5 in the SiN film 16. The plan pattern of the groove 16A shown in FIG. 5 shows about a half of it, and the whole pattern is a lattice pattern surrounding predetermined rectangular areas.

The conditions of the dry etching process for parallel plate type plasma etching may be, for example:

Gas: $SF_6$/He
Reaction chamber pressure: about 0.50 [Torr]

The conditions of the dry etching process for plasma downflow etching may be, for example:

Gas: $SF_6$/He
Reaction chamber pressure: about 0.20 [Torr]

After the dry etching process, the resist layer 18 is removed by a well known manner.

Figure 3:
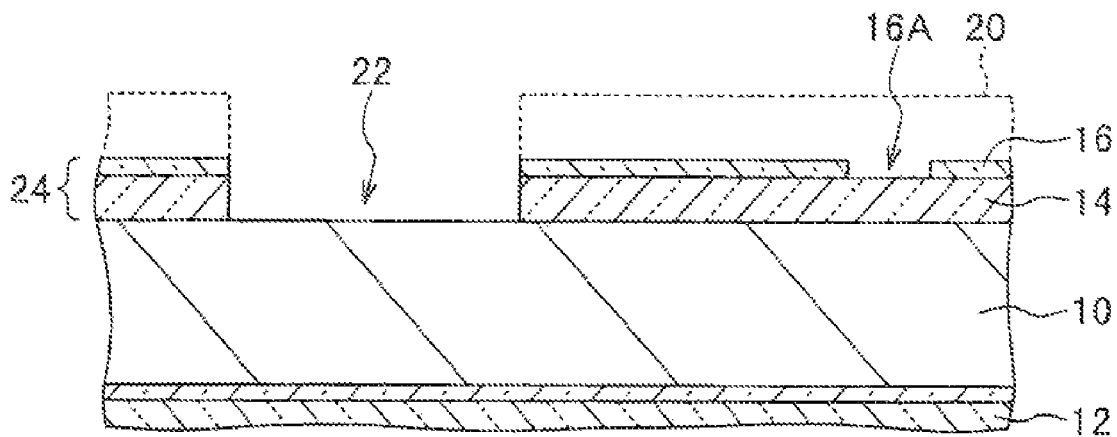
FIG. 3 is a cross sectional view illustrating an etching mask forming process following the process shown in FIG. 2.

In the process shown in FIG. 3, by using a resist layer 20 as a mask, the lamination layer of the $SiO_2$ film 14 and SiN film 16 (silicon nitride/silicon oxide lamination layer) is selectively dry etched to form a mask opening 22 having a rectangular plan pattern shown in FIG. 5 and to leave an etching mask 24 mad of the unetched lamination layer of the films 14 and 16. The mask opening 22 has a shape corresponding to a desired diaphragm. For example, the mask opening 22 has four sides parallel to those of the rectangular area surrounded by the groove 16A.

The conditions of the dry etching process for parallel plate type plasma etching may be, for example:

Gas: $CF_4/O_2$
Reaction chamber pressure: about 1.0 [Torr]

The conditions of the dry etching process for magnetron reaction ion etching (RIE) may be, for example:

Gas: $CF_4/CHF_3/N_2$
Reaction chamber pressure: about 0.25 [Torr]

The conditions of the dry etching process for narrow gap electrode RIE may be, for example:

Gas: $CF_4/CHF_3$/He
Reaction chamber pressure: about 0.15 [Torr]

After the dry etching process, the resist layer 20 is removed by a well known method. The selective dry etching process shown in FIG. 3 may be performed prior to the selective dry etching process shown in FIG. 2.

Figure 4:
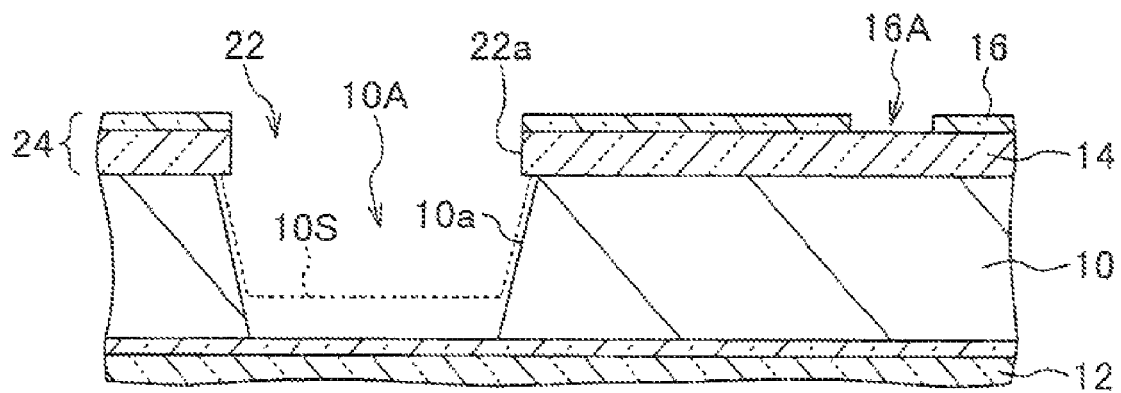
FIG. 4 is a cross sectional view illustrating an etching process following the process shown in FIG. 3.

In the process shown in FIG. 4, by using the etching mask 24, the substrate 10 is selectively and anisotropically etched with alkali etchant to form a substrate opening 10A. The substrate opening 10A may reach the etching stopper film 12 or a silicon region having a predetermined thickness on the etching stopper film 12 may be left as indicated by a broken line 10S.

The alkali etchant may be TMAH or potassium hydroxide (KOH), both at a density of about 25 [%] and a liquid temperature of about 90 [° C.]. The density is preferably slightly low because if the density is high, the surface of etched silicon becomes much more rough. However, if the density is too low, the etching rate lowers and the process time prolongs.

Figure 11:
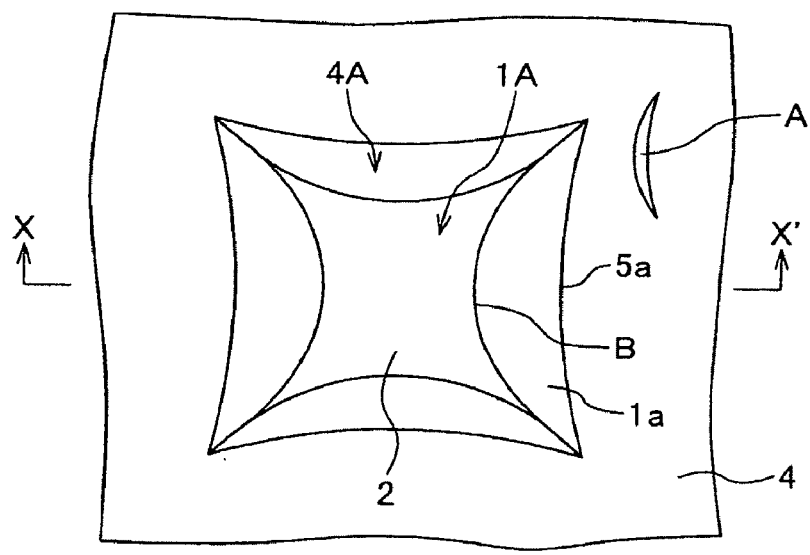
FIG. 11 is a top view of the substrate shown in FIG. 10.

The following Table 1 shows whether or not each sample had the abnormalities A and B (refer to FIG. 11) after the wet etching process shown in FIG. 4 for 15 hours using, as the etchant, TMAH at the density of 22 [%] and a liquid temperature of 90 [° C.].

TABLE 1

| Sample No. | 1 | 2 | 3 | 4 | 5 | 6 | 7 | 8 | 9 |
|---|---|---|---|---|---|---|---|---|---|
| Thickness $T_N$ (nm) of SiN film | 230 | 280 | 280 | 310 | 200 | 280 | 310 | 170 | 140 |
| Thickness $T_O$ (nm) of $SiO_2$ film | 50 | 200 | 350 | 350 | 450 | 450 | 450 | 450 | 450 |
| Total Thickness | 330 | 480 | 630 | 660 | 650 | 630 | 760 | 620 | 590 |
| T = $T_O$ 30 $T_N$ Film thickness Ratio R = $T_O/T_N$ | 0.17 | 0.71 | 1.25 | 1.12 | 2.25 | 1.60 | 1.45 | 2.64 | 3.21 |

TABLE 1-continued

| Sample No. | 1 | 2 | 3 | 4 | 5 | 6 | 7 | 8 | 9 |
|---|---|---|---|---|---|---|---|---|---|
| Without Abnormal A | ○ | ○ | ○ | x | ○ | ○ | Δ | ○ | ○ |
| Without Abnormal B | x | Δ | ○ | Δ | ○ | ○ | ○ | ○ | ○ |

Table 1 shows a thickness $T_N$ [nm] of the SiN film 16, a thickness $T_O$ of the SiO$_2$ film 14, a total thickness $T=T_O+T_N$ and a film thickness ratio $R=T_O/T_N$ of each sample. A circle symbol indicates that there is abnormality, a cross symbol indicates there is no abnormality and a triangle symbol indicates that there is slight abnormality to the extent that it will not adversely affect the performance of the device.

It can be understood from Table 1 that the samples #3, #5, #6, #8 and #9 have neither the abnormality A nor the abnormality B and that the film thickness ratio R is required to be 1.25 or higher. At R=1.45, although the abnormality A is recognized slightly, this abnormality A occurs outside of the etched area so that the device performance does not pose any problem and the device can be used in practice. In the range from R=1.60 to 3.21, no abnormality and rejection are recognized. At R larger than 3.21, it takes a long time to form the SiO$_2$ film 14, resulting in the disadvantage of cost. It is therefore preferable to set R in the range of 1.25 (more preferably $1.60)\leq R\leq 3.21$.

If the thickness $T_O$ of the SiO$_2$ film 14 is thin, then the ratio R becomes small assuming that $T_N$ is constant. If R becomes smaller than 1.25, it is not preferable. If $T_O$ is thin, it can be considered that stress in the silicon nitride film is likely to be applied to the substrate 10 and that stress relaxation in the substrate becomes insufficient to be likely to generate the abnormality B. If $T_O$ is thick, the film forming time prolongs, resulting in the disadvantage of cost. It is therefore preferable to set $T_O$ in the range of 350 [nm]$\leq T_O$ 450 [nm].

If the thickness $T_N$ of the SiN film 16 is thicker than 300 [nm] (sample #4), the abnormality A is likely to occur. The thickness $T_N$ is therefore preferably thin. If $T_N$ is thinner than 140 [nm], it is necessary to make the SiO$_2$ film 14 thinner in order to set R to 3.21 or smaller. In such a case, there may arise problems as follows. (a) When the thickness of SiO$_2$ film is too thin, the effect of stress release becomes insufficient, to allow generation of abnormality B. (b) When the thickness of SiN film is too thin, the SiN film may be wounded during the handling of the wafer. Then, the SiO$_2$ film may be etched through the wound during wet etching, to allow generation of abnormalities A and B. It is therefore preferable to set $T_N$ in the range of 140 [nm]$\leq T_N\leq$300 [nm]. Taking the productivity and cost into consideration, $T_N$ is preferably set in the range of 170 [nm]$\leq T_N\leq$280 [nm].

FIGS. 4 and 5 show the substrate opening 10A and etching mask 24 without the abnormalities A and B. The SiN film 16 has no crack abnormality A. The shape abnormality B with an inner convex curved shape is not formed at the inner wall 22a of the mask opening 22 and the inner wall 10a of the substrate opening 10A.

In the above-described embodiment, if the area of the substrate opening 10A is small, the balance of film stress is good so that the film stress relaxing groove 16A may be omitted. Namely, after the process shown in FIG. 1 is executed, the process shown in FIG. 3 can be executed by omitting the process shown in FIG. 2. In this case, the abnormalities A and B can be avoided only by setting the thicknesses of the SiO$_2$ film 14 and SiN film 16 so that the ratio $R=T_O/T_N$ of the thickness of the SiO$_2$ film to the thickness of the SiN film 16 becomes 1.25 or larger.

Figure 6:
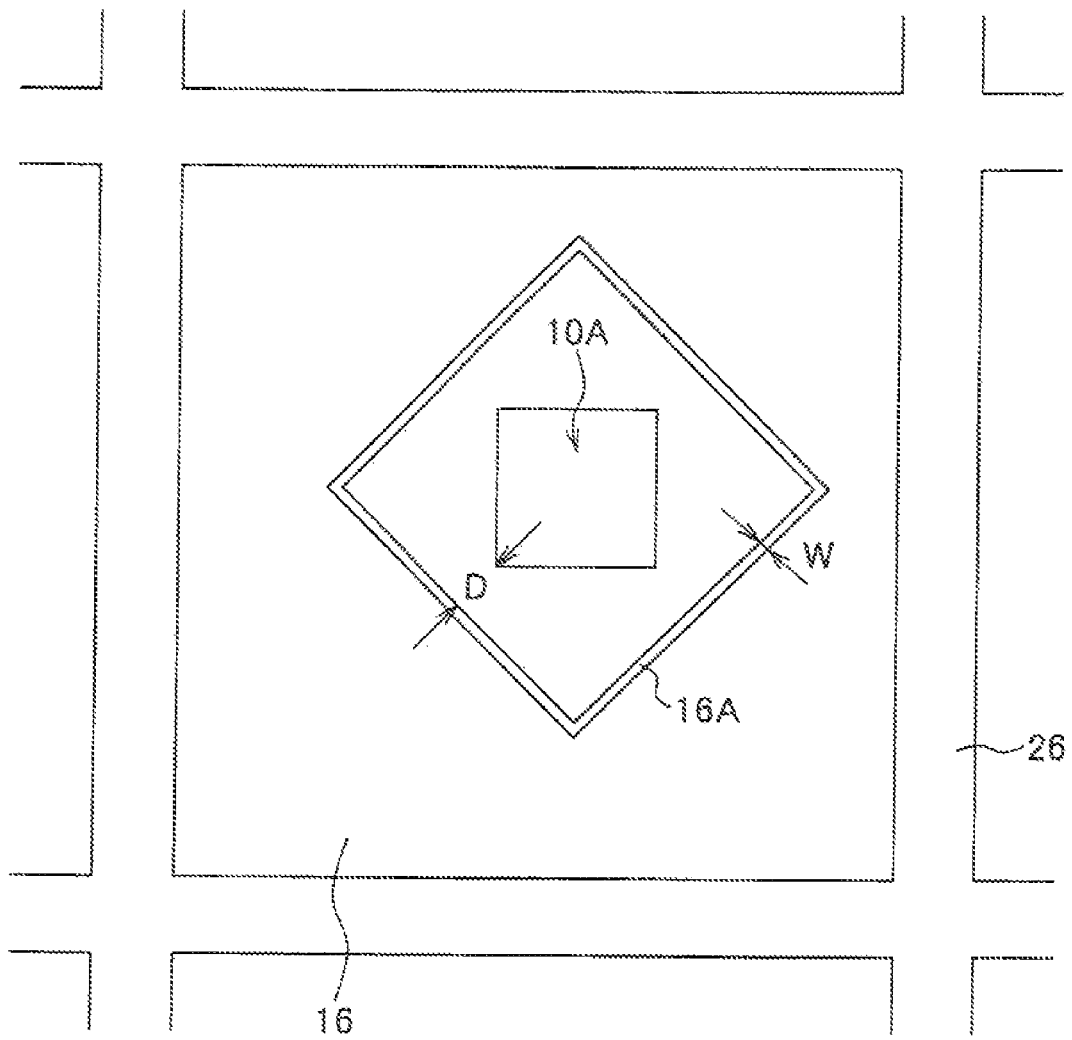
FIG. 6 is a top view of a film stress relaxing groove according to a first modification.
Figure 7:
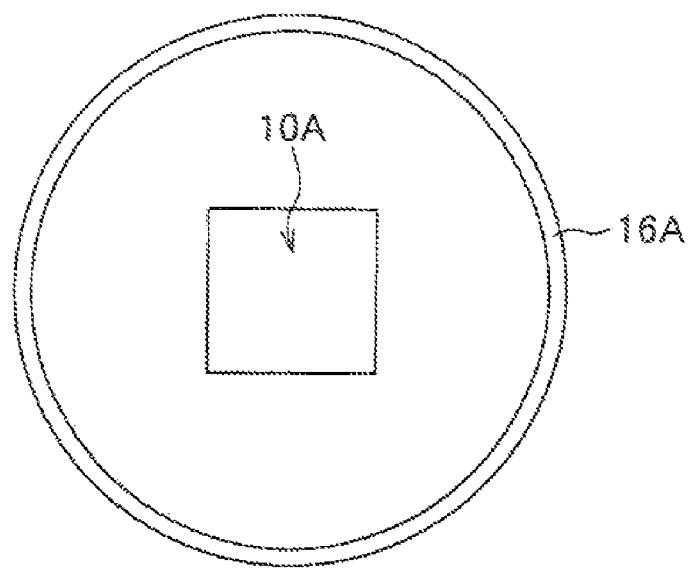
FIG. 7 is a top view of a film stress relaxing groove according to a second modification.
Figure 8:
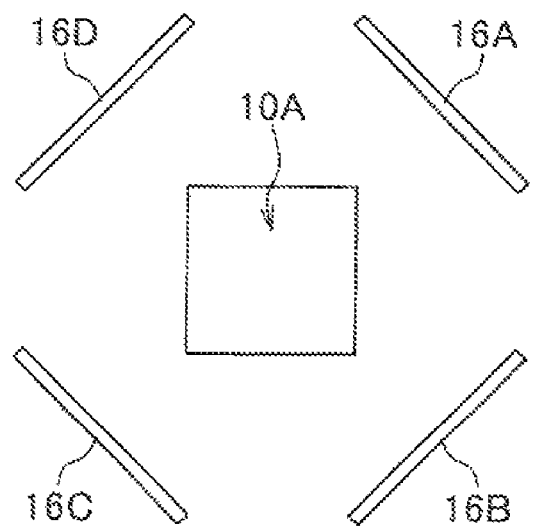
FIG. 8 is a top view of a film stress relaxing groove according to a third modification.
Figure 9:
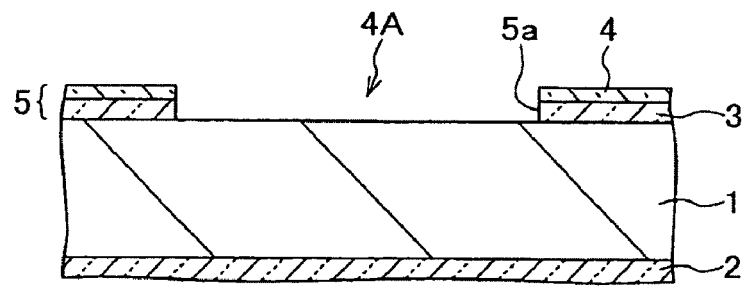
FIG. 9 is a cross sectional view illustrating an etching mask forming process in association with the inventor's studies.
Figure 10:
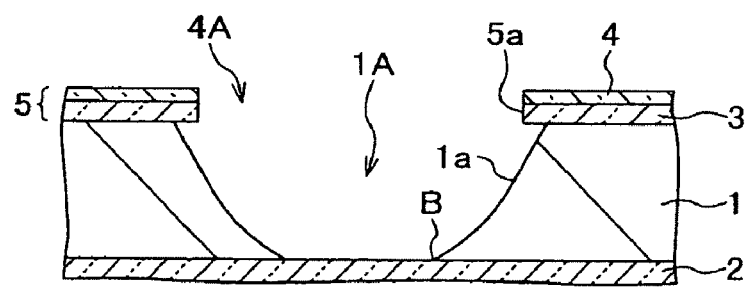
FIG. 10 is a cross sectional view illustrating an etching process following the process shown in FIG. 9.

FIGS. 6 to 8 show first to third modifications of the film stress relaxing groove. In these Figures, like elements to those shown in FIGS. 1 to 5 are represented by using identical reference symbols and the detailed description thereof is omitted.

In the example shown in FIG. 6, in a rectangular silicon chip area surrounded by a scribe area 26, a rectangular substrate opening 10A is formed. Stress is likely to concentrate on the corners of the rectangular substrate opening 10A. A rectangular film stress groove 16A is formed in an SiN film 16. The rectangular film stress relaxing groove 16A surrounds the substrate opening 10A, and the four sides of the rectangular film stress relaxing groove 16A are not parallel to the four sides of the substrate opening 10A but parallel to the diagonal directions of the substrate opening 10A. The width W of the groove 16A can be set to 10 [μm] or wider, and the distance D between each corner of the substrate opening 10A and a corresponding side of the groove 16A can be set to 100 [μm] or longer.

In the example shown in FIG. 7, a circular ring-shaped film stress relaxing groove 16A is formed surrounding a substrate opening 10A. In the example shown in FIG. 8, four film stress relaxing grooves 16A to 16D are formed surrounding a substrate opening 10A and in correspondence with the four corners of the substrate opening 10A.

In all of the examples shown in FIGS. 6 to 8, since the film stress relaxing groove is formed near the four corners of the substrate opening 10A, concentration of stress upon the corners can be suppressed.

The present invention has been described in connection with the preferred embodiments. The invention is not limited only to the above embodiments. It will be apparent to those skilled in the art that other various modifications, improvements, combinations, and the like can be made.

What I claim is:

1. An etching mask formed on a silicon substrate, comprising:
   a silicon oxide film formed on a principal surface of the silicon substrate;
   a silicon nitride film formed on the silicon oxide film, wherein a thickness $T_O$ of said silicon oxide film and a thickness $T_N$ of said silicon nitride film are set to have a film thickness ratio $T_O/T_N$ of about 1.25 or more;
   an aperture formed through a lamination of said silicon nitride film and said silicon oxide film; and
   at least one stress relaxing groove formed in said silicon nitride film, relaxing film stress in said silicon nitride film affecting said aperture.

2. The etching mask according to claim 1, wherein said at least one stress relaxing groove comprises a pair of portions opposing to each other across said aperture.

3. The etching mask according to claim 2, wherein said aperture has rectangular shape, and said pair portions are located on an diagonal line of said rectangular shape.

4. The etching mask according to claim 1, wherein said at least one stress relaxing groove has a lattice pattern.

5. The etching mask according to claim 1, wherein said aperture has a rectangular shape having four edges, and said at least one stress relaxing groove has sides not parallel to the edges of said aperture.

6. The etching mask according to claim 1, wherein said at least one stress relaxing groove has a width of 10 μm or wider.

7. The etching mask according to claim 1, wherein a distance between said aperture and said at least one stress groove is about 100 μm or more.

8. The etching mask according to claim 1, wherein said at least one stress relaxing groove surrounds said aperture.

9. The etching mask according to claim 1, wherein said aperture has corners, and said at least one stress relaxing groove has portions located near the corners.

10. An etching mask formed on a silicon substrate, comprising:
- a silicon oxide film formed on a principal surface of the silicon substrate;
- a silicon nitride film formed on the silicon oxide film;
- a mask opening of rectangular shape formed through a partial region of lamination of said silicon nitride film and said silicon oxide film; and
- at least one film stress relaxing groove formed in said silicon nitride film, relaxing film stress to in said silicon nitride film affecting said mask opening.

11. The etching mask according to claim 10, wherein said at least one stress relaxing groove comprises a pair of portions opposing to each other across said mask opening.

12. The etching mask according to claim 11, wherein said mask opening has rectangular shape, and said pair portions are located on an diagonal line of said rectangular shape.

13. The etching mask according to claim 10, wherein said at least one stress relaxing groove has a lattice pattern.

14. The etching mask according to claim 10, wherein said aperture has a rectangular shape having four edges, and said at least one stress relaxing groove has sides not parallel to the edges of said mask opening.

15. The etching mask according to claim 10, wherein said at least one stress relaxing groove has a width of about 10 μm or wider.

16. The etching mask according to claim 10, wherein a distance between said mask opening and said at least one stress groove is 100 μm or more.

17. The etching mask according to claim 10, wherein said at least one stress relaxing groove surrounds said mask opening.

18. The etching mask according to claim 10, wherein said mask opening has corners, and said at least one stress relaxing groove has portions located near the corners.

* * * * *